(12) United States Patent
Myers et al.

(10) Patent No.: US 10,003,699 B1
(45) Date of Patent: Jun. 19, 2018

(54) OPTIMIZING A RINGTONE FOR AUDIBILITY

(71) Applicant: International Business Machines Corporation, Armonk, NY (US)

(72) Inventors: Andrew C. Myers, Columbus, OH (US); Vincent Tkac, Delaware, OH (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/472,334

(22) Filed: Mar. 29, 2017

(51) Int. Cl.
| | |
|---|---|
| *H04B 1/38* | (2015.01) |
| *H04M 1/00* | (2006.01) |
| *H04M 19/04* | (2006.01) |
| *H04M 1/725* | (2006.01) |
| *H04R 29/00* | (2006.01) |
| *H03G 3/32* | (2006.01) |

(52) U.S. Cl.
CPC ............ *H04M 19/044* (2013.01); *H03G 3/32* (2013.01); *H04M 1/72569* (2013.01); *H04R 29/001* (2013.01)

(58) Field of Classification Search
CPC .................................................. H04M 19/044
USPC .......................................... 455/414.1, 567, 5
See application file for complete search history.

(56) References Cited

U.S. PATENT DOCUMENTS

| | | | |
|---|---|---|---|
| 5,329,593 A | | 7/1994 | Lazzeroni et al. |
| 8,334,888 B2 * | | 12/2012 | Neuman ............... H04M 19/04 |
| | | | 348/14.01 |
| 8,868,137 B2 * | | 10/2014 | Hicks, III .......... G10K 11/1788 |
| | | | 455/569.1 |
| 8,897,840 B1 * | | 11/2014 | Hyde .................... H04M 19/04 |
| | | | 381/101 |
| 9,531,888 B2 * | | 12/2016 | Vaughn ................. H04M 19/04 |
| 9,854,081 B2 * | | 12/2017 | Shoemaker .......... H04M 1/7253 |

(Continued)

FOREIGN PATENT DOCUMENTS

| | | |
|---|---|---|
| EP | 1795041 A2 | 6/2007 |
| WO | 2004073232 A2 | 8/2004 |

(Continued)

OTHER PUBLICATIONS

Unknown, "SoundHound—SoundHound App", http://www.soundhound.com/soundhound, Copyright 2017 Soundhound Inc., 3 pages.

(Continued)

*Primary Examiner* — Tilahun B Gesesse
(74) *Attorney, Agent, or Firm* — Maeve M. Carpenter; Hunter E. Webb; Keohane & D'Alessandro PLLC (57) ABSTRACT

Approaches presented herein enable optimizing a ringtone on a mobile communication device so that it may be audible to a user among ambient music. Specifically, an incoming communication (e.g., phone call) or other event (e.g., incoming notification, alarm, etc.) that is associated with a ringtone is detected. Any ambient music is detected and identified. A waveform associated with the ringtone and a waveform associated with the ambient music are analyzed. Based on the analysis, the ringtone is initiated. For example, a peak of the ringtone waveform may be aligned with a trough of the ambient music waveform to determine a point to initiate the ringtone among the ambient music.

17 Claims, 6 Drawing Sheets

(56) References Cited

U.S. PATENT DOCUMENTS

| | | | |
|---|---|---|---|
| 2008/0132290 A1* | 6/2008 | Sharabi | H04M 1/72519 455/567 |
| 2008/0161063 A1* | 7/2008 | Schuster | H04M 19/044 455/567 |
| 2008/0161064 A1* | 7/2008 | Lewis | H04M 19/04 455/567 |
| 2011/0200210 A1* | 8/2011 | Kemmochi | H04M 9/082 381/107 |
| 2012/0027216 A1* | 2/2012 | Tirry | H04M 1/72569 381/57 |
| 2014/0051405 A1* | 2/2014 | Chhaunker | H04M 1/6505 455/414.1 |
| 2014/0086422 A1* | 3/2014 | Huang | H03G 3/3089 381/57 |
| 2015/0005039 A1* | 1/2015 | Liu | H04M 1/72569 455/567 |
| 2015/0156614 A1* | 6/2015 | Chi | H04M 19/04 455/414.1 |

FOREIGN PATENT DOCUMENTS

| | | | |
|---|---|---|---|
| WO | 2008082741 | A1 | 7/2008 |
| WO | 2013170522 | A1 | 11/2013 |

OTHER PUBLICATIONS

Moon et al., "Applying signal detection theory to determine the ringtone volume of a mobile phone under ambient noise", International Journal of Industrial Ergonomics 47, Feb. 7, 2015, pp. 117-123.

R. Nave, "Interference of Sound", http://hyperphysics.phy-astr.gsu.edu/hbase/Sound/interf.html, Dec. 10, 2000, 4 pages.

\* cited by examiner

FIG. 6

US 10,003,699 B1

OPTIMIZING A RINGTONE FOR AUDIBILITY

TECHNICAL FIELD

This invention relates generally to mobile communications and, more specifically, to optimizing a ringtone on a mobile communication device based on the ambient musical noise in the environment so that it may be audible to a user.

BACKGROUND

The use of electronic devices such as smartphones and tablets has become more and more pervasive in society. The varied functions that these mobile communication devices can perform continue to expand. One primary use of a mobile communication device may be to communicate with others. Typically, a user is notified of an incoming communication on a mobile communication device via a ringtone. This ringtone can simply refer to a sound made by a mobile communication device to indicate an incoming call or text message. Not literally a tone or bell-line ring anymore, the term is most often used today to refer to customizable sounds used on mobile communication devices.

SUMMARY

In general, approaches presented herein enable optimizing a ringtone on a mobile communication device so that it may be audible to a user among ambient music. Specifically, an incoming communication (e.g., phone call) or other event (e.g., incoming notification, alarm, etc.) that is associated with a ringtone is detected. Any ambient music is detected and identified. A waveform associated with the ringtone and a waveform associated with the ambient music are analyzed. Based on the analysis, the ringtone is initiated. For example, a peak of the ringtone waveform may be aligned with a trough of the ambient music waveform to determine a point to initiate the ringtone among the ambient music.

One aspect of the present invention includes a computer-implemented method for optimizing a ringtone, the method comprising: detecting, in response to an event to initiate the ringtone on a recipient communication device, an ambient music within a vicinity of the recipient communication device; retrieving, based on an identification of the ambient music, a waveform associated with the ambient music; analyzing a waveform associated with the ringtone and the retrieved waveform associated with the ambient music; and initiating, based on the analysis, the ringtone on the recipient communication device that maximizes an audibility of the ringtone within the vicinity Another aspect of the present invention includes a computer program product for optimizing a ringtone, and program instructions stored on the computer readable storage device, to: detect, in response to an event to initiate the ringtone on a recipient communication device, an ambient music within a vicinity of the recipient communication device; detect an ambient music within a vicinity of the recipient communication device; retrieve, based on an identification the ambient music, a waveform associated with the ambient music; analyze a waveform associated with the ringtone and the retrieved waveform associated with the ambient music; and initiate, based on the analysis, the ringtone on the recipient communication device that maximizes an audibility of the ringtone within the vicinity.

Yet another aspect of the present invention includes a computer system for optimizing a ringtone, the computer system comprising: a memory medium comprising program instructions; a bus coupled to the memory medium; and a processor for executing the program instructions, the instructions causing the system to: detect, in response to an event to initiate the ringtone on a recipient communication device, an ambient music within a vicinity of the recipient communication device; detect an ambient music within a vicinity of the recipient communication device; retrieve, based on an identification the ambient music, a waveform associated with the ambient music; analyze a waveform associated with the ringtone and the retrieved waveform associated with the ambient music; and initiate, based on the analysis, the ringtone on the recipient communication device that maximizes an audibility of the ringtone within the vicinity.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which illustrative embodiments are shown. It will be appreciated that this disclosure may be embodied in many different forms and should not be construed as limited to the illustrative embodiments set forth herein. Rather, these embodiments are provided so that this disclosure will be thorough and complete and will fully convey the scope of this disclosure to those skilled in the art.

Furthermore, the terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. Furthermore, similar elements in different figures may be assigned similar element numbers. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless specifically stated otherwise, it may be appreciated that terms such as "processing", "detecting", "determining", "evaluating", "receiving", or the like, refer to the action and/or processes of a computer or computing system, or similar electronic data center device, that manipulates and/or transforms data represented as physical quantities (e.g., electronic) within the computing system's registers and/or memories into other data similarly represented as physical quantities within the computing system's memories, registers or other such information storage, transmission, or viewing devices. The embodiments are not limited in this context.

As stated above, embodiments of the present invention enable optimizing a ringtone on a mobile communication device so that it may be audible to a user among ambient music. Specifically, an incoming communication (e.g., phone call) or other event (e.g., incoming notification, alarm, etc.) that is associated with a ringtone is detected. Any ambient music is detected and identified. A waveform associated with the ringtone and a waveform associated with the ambient music are analyzed. Based on the analysis, the ringtone is initiated. For example, a peak of the ringtone waveform may be aligned with a trough of the ambient music waveform to determine a point to initiate the ringtone among the ambient music.

The use of electronic devices has become more and more pervasive in society, and many users own multiple such devices. The varied functions that these devices can perform continue to expand. The expansion often includes the integration of personal computer technology into mobile communication devices, such as smartphones and tablets. By utilizing computer technology, users can now have access to computing functions and resources in multiple devices. With the near ubiquity of mobile communication devices, many consumers are using these devices as their primary device for communicating with others. The power of mobile communication devices comes from their size and connectivity. The size makes the device truly portable allowing a user to carry the device virtually everywhere. The connectivity of the device allows the user to perform a plethora of functions, such as allowing the user to communicate with others via a variety of means (e.g., phone call, text message, etc.).

The inventors of the invention described herein have recognized certain deficiencies in known methods for receiving a communication (e.g., incoming phone call or text message) or other notification on a mobile communication device, such as a smartphone. More and more, people are on the run, using mobile communication devices to keep in contact with others. From a mobile communication device, a user can make/receive phone calls and/or send/receive text messages when communicating with others. When a call or message comes in on a mobile communication device, it is customary for the device to make a sound signaling the incoming communication. Such an action derives from traditional telephones, which typically made a ringing bell sound when someone called.

In certain embodiments, an advantage of this approach is optimizing a ringtone on a mobile communication device so that it may be audible to a user among ambient music. As used herein, the term "ambient music" may include any background or non-background music (i.e., musical song). Background music refers to various styles of music or soundscapes primarily intended to be passively listened to. It is not meant to be the main focus of an audience, but rather to supplement that which is meant to be focused upon. Traditional examples of background music include music played over a loudspeaker system in public places, such as at a retail venue, restaurant, or the like. Conversely, non-background music includes any music actively listened to by a user, such as music enjoyed via headphones or live music at a concert venue. A user may not wish to miss an incoming communication on a mobile communication device in case of emergency or any other reason making the communication urgent. When the user is surrounded by ambient music, an incoming communication (e.g., phone call, text message, etc.) may be easily missed because a ringtone of the mobile communication device may be drowned out by the ambient music.

Ambient music and sounds from a ringtone reach a user's ear through sound waves. A sound wave is the pattern of disturbance caused by the movement of energy traveling through a medium (e.g., air) as it moves away from the source of the sound. The source is some object that causes a vibration, such as a musical instrument, sound speaker, or a person's vocal chords. The vibration disturbs the particles in the surrounding medium, and those particles disturb those next to them, and so on. The pattern of the disturbance creates outward movement in a wave pattern, like waves of seawater on the ocean. The wave carries the sound energy through the medium, usually in all directions and less intensely as it moves farther from the source. Two sound waves which exist in the same medium will interfere with each other, sometimes making it difficult to distinguish one sound wave from another. As used herein, the term "waveform" refers to a graphical representation of the shape and form of a signal moving in a medium. For sound, the term describes a depiction of the pattern of sound pressure variation (or amplitude) in a time domain. The approaches described herein provide a seamless way for automatically analyzing an upcoming waveform of the ambient music in conjunction to the ringtone waveform to find an appropriate time to initiate and/or way to adjust a ringtone so that its sound is audible to the user among the ambient music. This approach can help alleviate a user's stress about missing any urgent communications.

Figure 1:
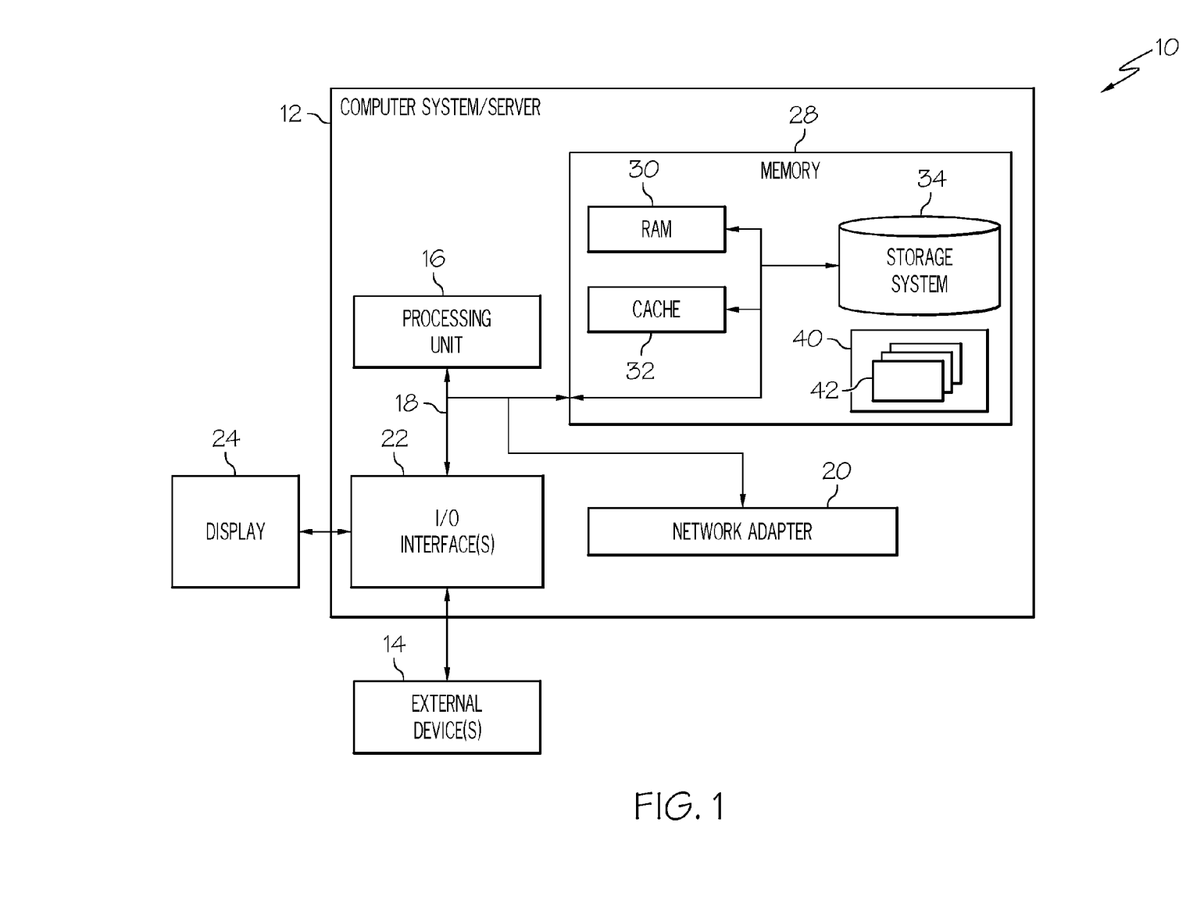
FIG. 1 shows an architecture 10 in which the invention may be implemented according to illustrative embodiments.

Referring now to FIG. 1, a computerized implementation 10 of an embodiment for optimizing a ringtone on a mobile communication device so that it may be audible to a user among ambient music will be shown and described. Computerized implementation 10 is only one example of a suitable implementation and is not intended to suggest any limitation as to the scope of use or functionality of embodiments of the invention described herein. Regardless, computerized implementation 10 is capable of being implemented and/or performing any of the functionality set forth hereinabove.

In computerized implementation 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

This is intended to demonstrate, among other things, that the present invention could be implemented within a network environment (e.g., the Internet, a wide area network (WAN), a local area network (LAN), a virtual private network (VPN), etc.), a cloud computing environment, a cellular network, or on a stand-alone computer system. Communication throughout the network can occur via any combination of various types of communication links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet. Still yet, computer system/server 12 is intended to demonstrate that some or all of the components of implementation 10 could be deployed, managed, serviced, etc., by a service provider who offers to implement, deploy, and/or perform the functions of the present invention for others.

Computer system/server 12 is intended to represent any type of computer system that may be implemented in deploying/realizing the teachings recited herein. Computer system/server 12 may be described in the general context of computer system executable instructions, such as program modules, being executed by a computer system. Generally, program modules may include routines, programs, objects, components, logic, data structures, and so on, that perform particular tasks or implement particular abstract data types. In this particular example, computer system/server 12 represents an illustrative system for optimizing a ringtone on a mobile communication device so that it may be audible to a user among ambient music. It should be understood that any other computers implemented under the present invention may have different components/software, but can perform similar functions.

Computer system/server 12 in computerized implementation 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Processing unit 16 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 16 collects and routes signals representing inputs and outputs between external devices 14 and input devices (not shown). The signals can be transmitted over a LAN and/or a WAN (e.g., T1, T3, 56 kb, X.25), broadband connections (ISDN, Frame Relay, ATM), wireless links (802.11, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 16 executes computer program code, such as program code for optimizing a ringtone on a mobile communication device so that it may be audible to a user among ambient music, which is stored in memory 28, storage system 34, and/or program/utility 40. While executing computer program code, processing unit 16 can read and/or write data to/from memory 28, storage system 34, and program/utility 40.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media, (e.g., VCRs, DVRs, RAID arrays, USB hard drives, optical disk recorders, flash storage devices, and/or any other data processing and storage elements for storing and/or processing data). By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program code embodied on a computer readable medium may be transmitted using any appropriate medium including, but not limited to, wireless, wireline, optical fiber cable, radio-frequency (RF), etc., or any suitable combination of the foregoing.

Program/utility 40, having a set (at least one) of program modules 42, may be stored in memory 28 by way of example, and not limitation. Memory 28 may also have an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a consumer to interact with computer system/server 12; and/or any devices (e.g., network card, modem, etc.) that enable computer system/server 12 to communicate with one or more other computing devices. Such communication can occur via I/O interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 2:
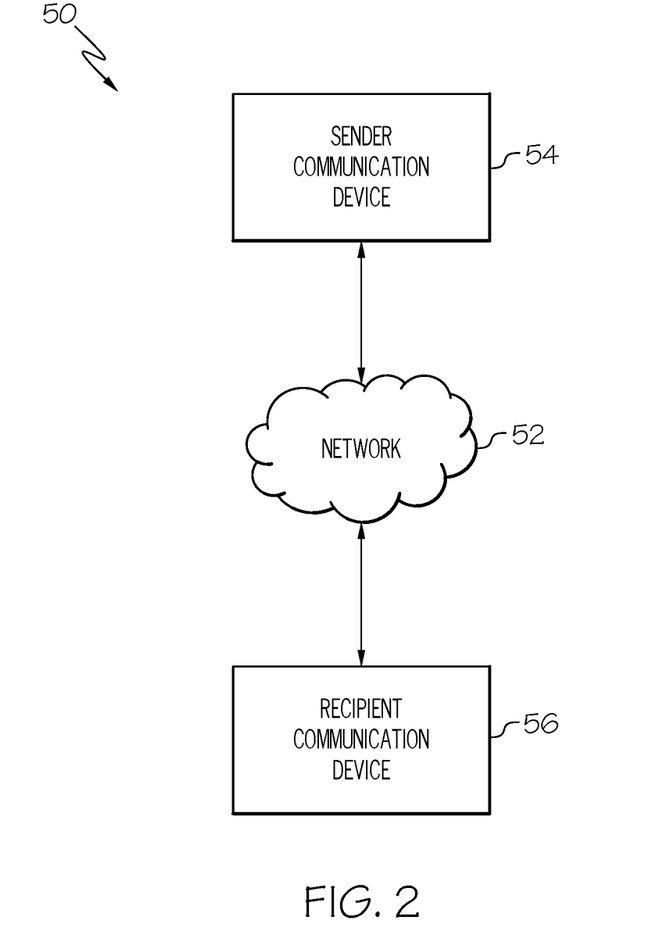
FIG. 2 shows a generic system diagram 50 in which a mobile communication device receiving an incoming communication may operate according to illustrative embodiments.

FIG. 2 illustrates a generic system diagram 50 in which a mobile communication device (e.g., recipient communication device 56) receiving an incoming communication is shown in an exemplary communication environment. As shown in FIG. 2, an embodiment of a system in accordance with an example embodiment may include wireline or wireless communication techniques, including Local Area Network (LAN), Wireless LAN (WLAN), Worldwide Interoperability for Microwave Access (WiMAX), Wireless Fidelity (WiFi), Ultra-Wide Band (UWB), Wibree techniques, or the like.

As such, recipient communication device 56 and sender communication device 54 may be enabled to communicate with network 52 and each other by any of numerous different access mechanisms. For example, mobile access mechanisms such as Wideband Code Division Multiple Access (W-CDMA), CDMA2000, Global System for Mobile communications (GSM), General Packet Radio Service (GPRS), and/or the like, may be supported, as well as wireless access mechanisms such as WLAN, WiMAX, and/or the like, and fixed access mechanisms such as Digital Subscriber Line (DSL), cable modems, Ethernet, and/or the like.

In example embodiments, recipient communication device 56 may include, but is not limited to, a smart phone, a cellular phone, a Voice over Internet Protocol (VoIP) phone, a personal data assistant (PDA), a personal entertainment device, a tablet, a smart watch, or any other mobile communication device capable of receiving an incoming communication (e.g., phone call, text message, etc.) from sender communication device 54 over network 52. In an exemplary embodiment, recipient communication device 56 may employ a computer system (e.g., computer system 12 of FIG. 1) capable of employing embodiments of the invention.

Figure 3:
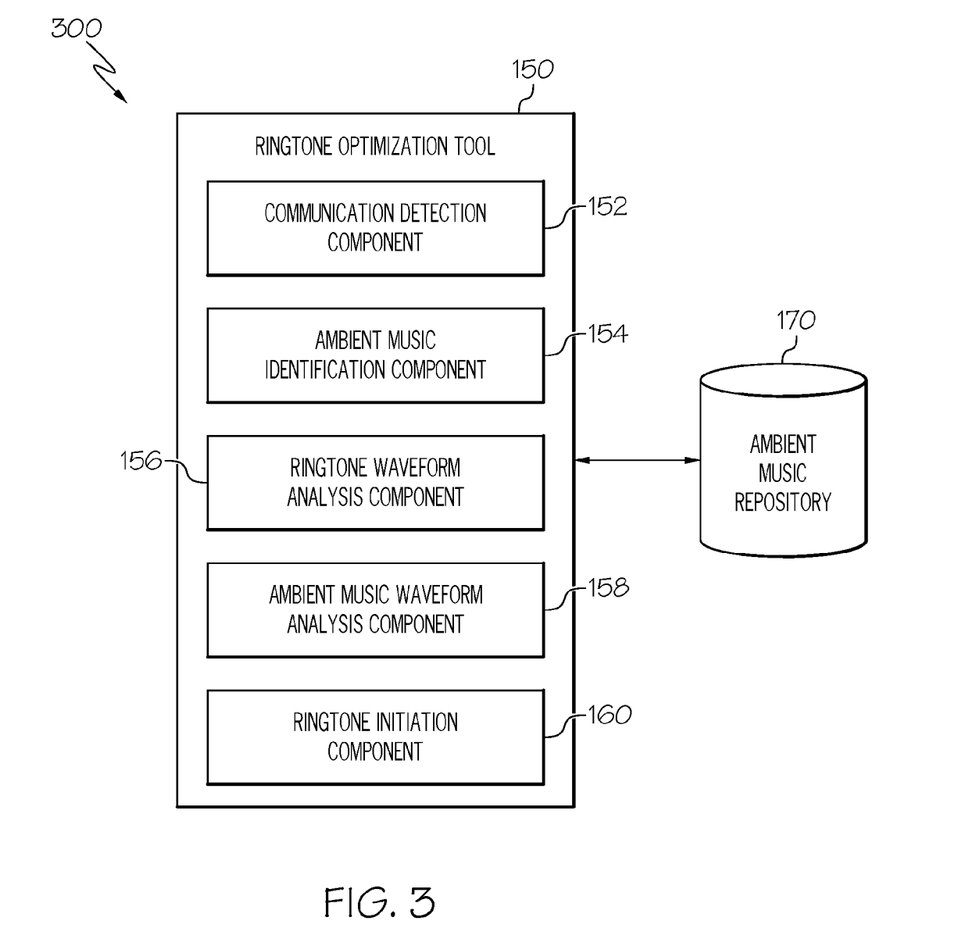
FIG. 3 shows a schematic diagram 300 illustrating an exemplary environment for implementation according to illustrative embodiments.

Referring now to FIG. 3, ringtone optimization tool 150 for optimizing a ringtone on a mobile communication device so that it may be audible to a user among ambient music is shown. In an exemplary embodiment, recipient communication device 56 (FIG. 2) may employ a ringtone optimization tool 150 (hereinafter "system 150"). As depicted, system 150 is shown within computer system/server 12. In general, system 150 can be implemented as program/utility 40 on computer system 12 of FIG. 1 and can enable the functions recited herein. It is further understood that system 150 may be incorporated within or work in conjunction with any type of system that receives, processes, and/or executes commands with respect to IT resources in a networked computing environment. Such other system(s) have not been shown in FIG. 3 for brevity purposes.

Communication detection component 152 of system 150, as executed by computer system/server 12, is configured to detect an incoming communication associated with a ringtone via a communication channel to a recipient mobile communication device (e.g., recipient communication device 56). As referred to herein, a communication channel may include, but is not limited to, a medium or channel through which an incoming communication is expressed. A communication channel may include any of various wired and/or wireless technologies available for accessing networks, such as the Internet. For example, state-of-the art smartphones can access the Internet using 3G, 4G, WiFi, and similar wireless technologies. Additionally, wireless technologies enable interconnectivity among two or more devices. Such technologies include Near Field Communication (NFC), WiFi Direct, Bluetooth, and others. As referred to herein, an incoming communication may include, but are not limited to, a voice call, video call, short message service (SMS) message (e.g., text message), multimedia messaging service (MMS) message (e.g., video message), instant message (e.g., chat message), push message from a mobile application, or the like, in which the incoming communication is associated with a ringtone.

Ambient music identification component 154 of system 150, as executed by computer system/server 12, is configured to detect and identify ambient music. In an embodiment, ambient music identification component 154 may use a built-in microphone to gather a brief sample of audio being played. The ambient music must be within a vicinity of recipient communication device 56 to adequately gather the brief sample. Ambient music identification component 154 may create an acoustic fingerprint or code unique to each track based on the sample and compare it against ambient music repository 170 for a match. In an embodiment, the unique code may be created based on a spectrogram that is generated for each track of music. The spectrogram is a graph representing three dimensions of music: frequency, amplitude, and time. An algorithm can then pick out points within the graph to produce the unique code. If ambient music identification component 154 finds a code match, it may be further configured to retrieve a waveform associated with the ambient music from ambient music repository 170. Ambient music repository 170 may include a relational database, which can be implemented in a combination of hardware (i.e., physical data storage hardware) and software (i.e., relational database software). If the ambient music is not identified, a waveform associated with the ambient music cannot be retrieved, and a ringtone associated with the incoming communication may be initiated without delay.

In an embodiment, ambient music identification component 154 may detect and identify ambient music only when communication detection component 152 detects an incoming communication. In another embodiment, ambient music identification component 154 may detect and identify ambient music continuously or semi-continuously without regard to communication detection component 152 by repeatedly monitoring for ambient music. For example, ambient music identification component 154 may monitor for ambient music every few seconds, every few minutes, when a user is at a location known to play ambient music (e.g., retail establishment, restaurant, concert venue, etc.), and/or the like, and/or any combination thereof. Detecting and identifying ambient music prior to an incoming communication can prevent any delay in retrieving a waveform associated with the ambient music by performing these necessary steps beforehand.

Ringtone waveform analysis component 156 of system 150, as executed by computer system/server 12, is configured to analyze a ringtone to determine a peak (or highest amplitude) portion in the ringtone. In an embodiment, the peak portion may be determined based on an amplitude associated with the ringtone. In another embodiment, frequency, pitch, volume, and/or other attribute of sound, and/or a combination thereof may be used when analyzing a waveform of a ringtone and/or ambient music. As used herein, amplitude refers to sound pressure as measured in decibels (dB). Unlike loudness, which is a subject measure of sound amplitude which varies from person to person, sound pressure is an objective measure of sound strength or intensity. A waveform is an image that represents an audio signal or recording. It shows the changes in amplitude over a certain amount of time. In an embodiment, the waveform may be dynamically generated based on the ringtone or retrieved from a repository.

Figure 4:
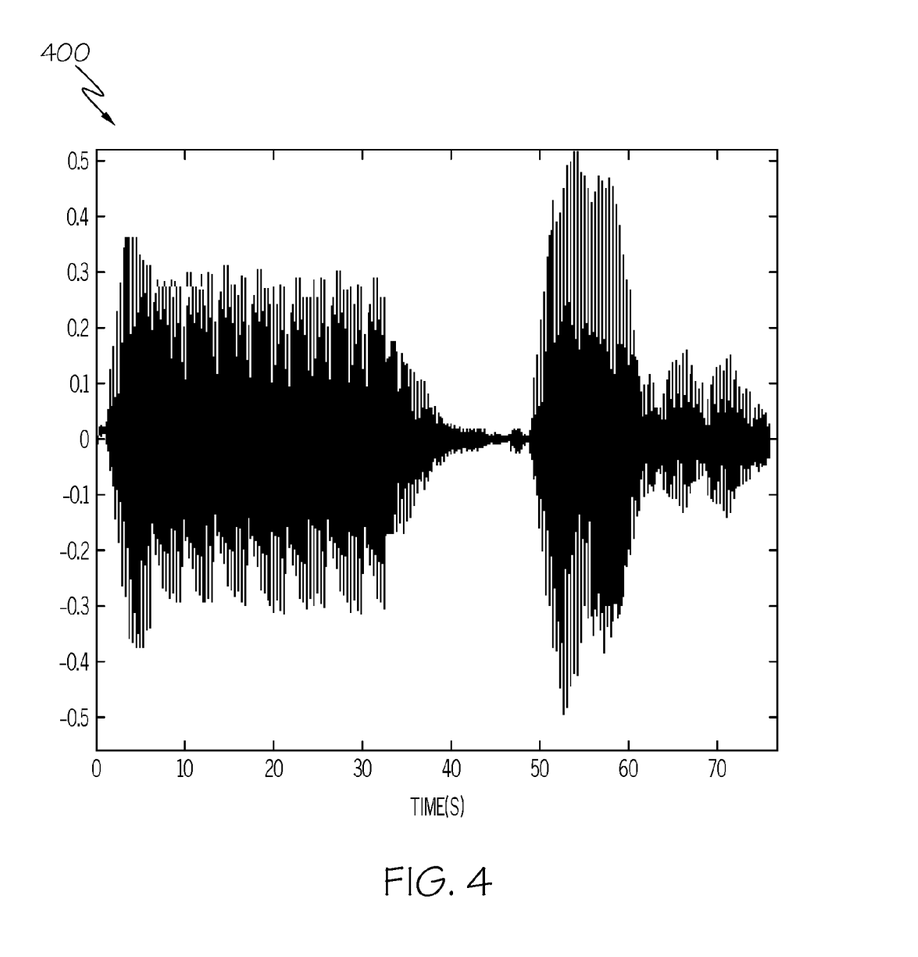
FIG. 4 shows a waveform 400 of an example ringtone according to illustrative embodiments.

FIG. 4 shows a waveform of an example ringtone. As shown, the vertical scale (i.e., y-axis) represents sound pressure or amplitude, the horizontal scale (i.e., x-axis) represents time in seconds. The diagram shows how sound pressure varies with respect to the atmospheric pressure, which is 0 sound pressure. The sound pressure rises and falls above and below the atmospheric pressure, alternating between compression and rarefaction. The region where the air is compressed is known as a compression, and the region where the medium is spread out is known as a rarefaction. This is roughly equivalent to what we perceive as the changes in loudness of the sound. The sound pressure scale goes from positive to negative to accommodate that alternation. The values of the sound pressure scale are arbitrary, although typically shown from 1.0 to −1.0.

Changes in a waveform can be good indicators as to when certain parts of a song or recording take place. For example, the waveform may be small when there is just a vocalist singing, but may become much larger when the drums and guitar come in. In other words, parts in a waveform having absolute values nearer to 0 sound pressure indicate quieter portions of the ringtone, while parts having higher absolute values from 0 indicate louder parts of the ringtone. For example, a portion of waveform 400 beginning at time 51 seconds to 60 seconds (approximately) indicate a relatively loud part of the ringtone, while a portion of waveform 400 beginning at time 40 seconds to 50 seconds (approximately) indicate a relatively soft part of the ringtone. The waveform allows ringtone waveform analysis component 156 to locate a peak portion of the ringtone.

Although a peak portion may be any duration, in an embodiment, waveform analysis component 156 may further be configured to locate a sustained peak portion of the ringtone lasting at least a predefined length of time (e.g., at least 5 seconds). In that instance, a peak value may be calculated as an average over a length of time. A peak portion lasting only a second or two may be easily missed by a user when the peak portion of the ringtone is initiated due to its short duration. For example, assume a first portion of the ringtone has a peak value equal to a second portion of the ringtone. If the first portion lasts 2 seconds but the second portion lasts 10 seconds, the second portion may be selected as the peak portion to be used for the ringtone. Selecting the second portion may increase the chances of the ringtone being audible to a user due to its extended length. As shown in FIG. 4, ringtone waveform analysis component 156 locates sustained peak portion of waveform 400 beginning at the 51$^{st}$ second of the ringtone. The peak portion of waveform 400 is located based on the highest sound pressure value of the ringtone. The peak portion of waveform 400 has a peak value of approximately 0.45.

Ambient music waveform analysis component 158 of system 150, as executed by computer system/server 12, is configured to analyze ambient music to determine a trough (or lowest amplitude) portion in the ambient music. In an embodiment, the trough portion may be determined based on an amplitude associated with the ambient music. Unlike ringtone waveform analysis component 156 which may determine a peak portion of an entire ringtone, ambient music waveform analysis component 158 determines a trough portion within an upcoming section of the ambient music when an incoming communication is received on recipient communication device 56. In an embodiment, a trough portion of the upcoming seconds (e.g., 8, 10, 12, etc.) of the ambient music may be located. For example, a trough portion within the upcoming 12 seconds of the ambient music may be located so that the delay in initiating the ringtone does not exceed 12 seconds. A sender placing a call may think his call has failed to go through if he doesn't hear it begin to ring on his end within that amount of time.

Figure 5:
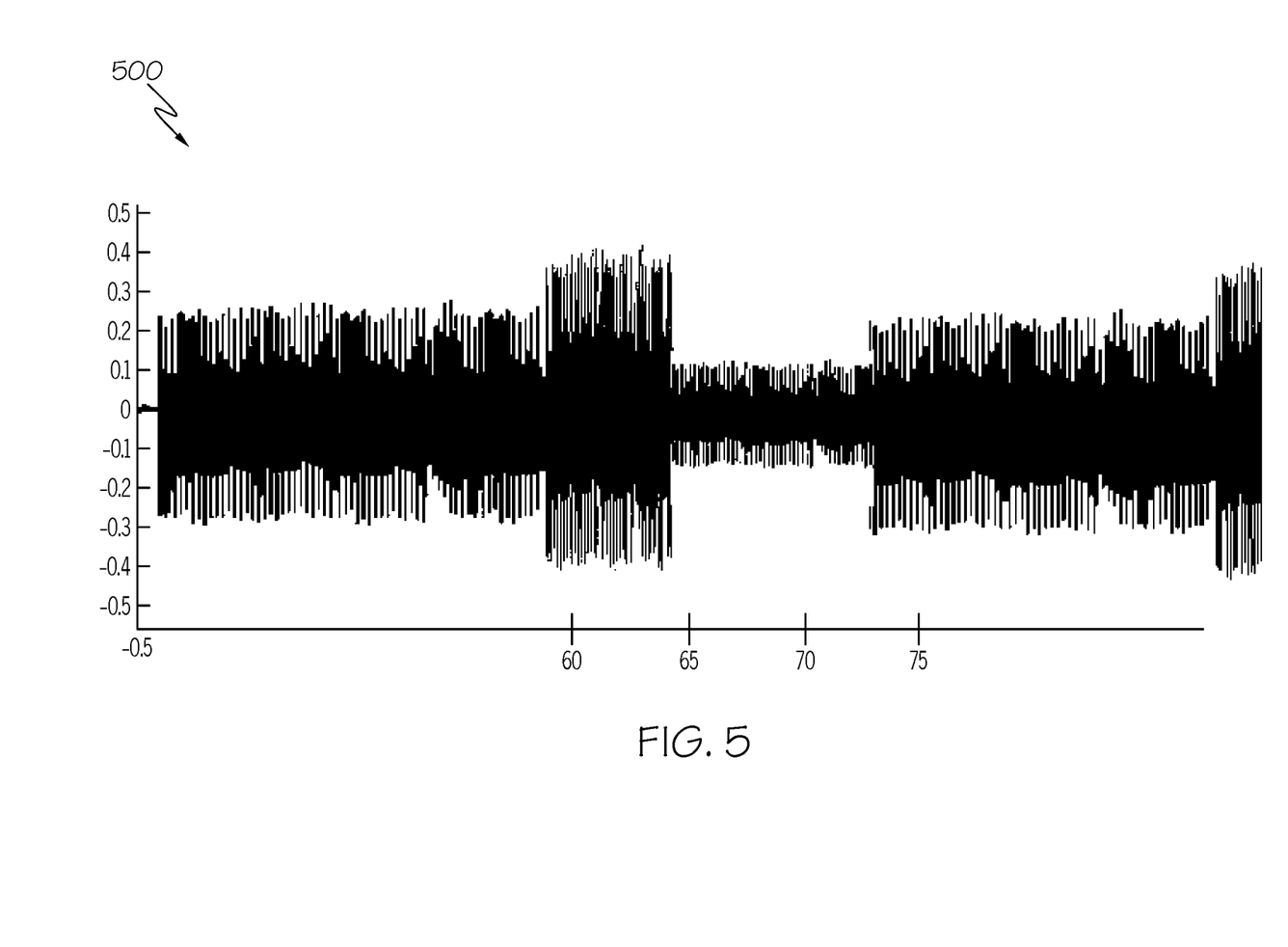
FIG. 5 shows a waveform 500 of example ambient music according to illustrative embodiments.

FIG. 5 shows a waveform 500 of example ambient music. Again, the vertical scale (i.e., y-axis) represents sound pressure or amplitude, the horizontal scale (i.e., x-axis) represents time in seconds. Recipient communication device 56 detects an incoming communication at time 60 seconds. As discussed earlier, ambient music waveform analysis component 158 analyzes waveform 500 of the ambient music to locate a trough portion. Only a section of waveform 500 yet to be played immediately following the time of detection of the incoming communication may be analyzed. In our example, only the part of waveform 500 following the 60-second mark may be analyzed when locating a trough portion since that is the part of the ambient music that is soon to be played. In an embodiment, only a predefined number of seconds (e.g., 12 seconds) immediately following a time an incoming communication is detected (e.g., 60-second mark in FIG. 5) may be analyzed when locating a trough portion to prevent an extended delay in initiating a ringtone. If a trough portion can be located at a point in the ambient music that will not be reached for another minute, it may not be appropriate to delay an initiation of a ringtone that long. As shown in FIG. 5, ambient music waveform analysis component 158 locates a trough portion beginning at the 64-second mark of waveform 500. The trough portion of waveform 500 is located based on the lowest sound pressure value of the ambient music within the predefined number of seconds of the ambient music to be played following detection of an incoming communication. In our example, the trough portion of waveform 500 has a trough value of approximately 0.15.

Ringtone initiation component 160 of system 150, as executed by computer system/server 12, is configured to initiate a ringtone associated with an incoming communication based on a waveform analysis of a ringtone and ambient music. In an embodiment, a peak portion of a ringtone is aligned with a trough portion of the ambient music so that the ringtone, when initiated, may be audible to a user. In our example, the peak portion of the ringtone beginning at the 51-second mark is aligned with the trough portion of the ambient music beginning at the 64-second mark. Therefore, when ambient music reaches the 65-second mark, ringtone initiation component 160 will initiate the ringtone beginning at the 51-second mark of the ringtone. Since the peak value (0.45) of the ringtone is greater than the trough value (0.15) of the ambient music, the ringtone may be audible to the user.

Alternatively or in addition, an attribute (e.g., volume, pitch, etc.) of a ringtone may be increased or decreased based on an analysis of a waveform of the ringtone and the ambient music. For example, if a peak value of a ringtone is not greater than a trough value of the ambient music, then ringtone initiation component 160 may increase the volume and/or increase or decrease the pitch of the ringtone in an effort to make it more audible to a user. The faster a sound wave oscillates, the higher pitch it will have. For example, on a guitar, a big heavy string will vibrate slowly and create a low sound or pitch. A thinner lighter string will vibrate faster and create a high sound or pitch.

Figure 6:
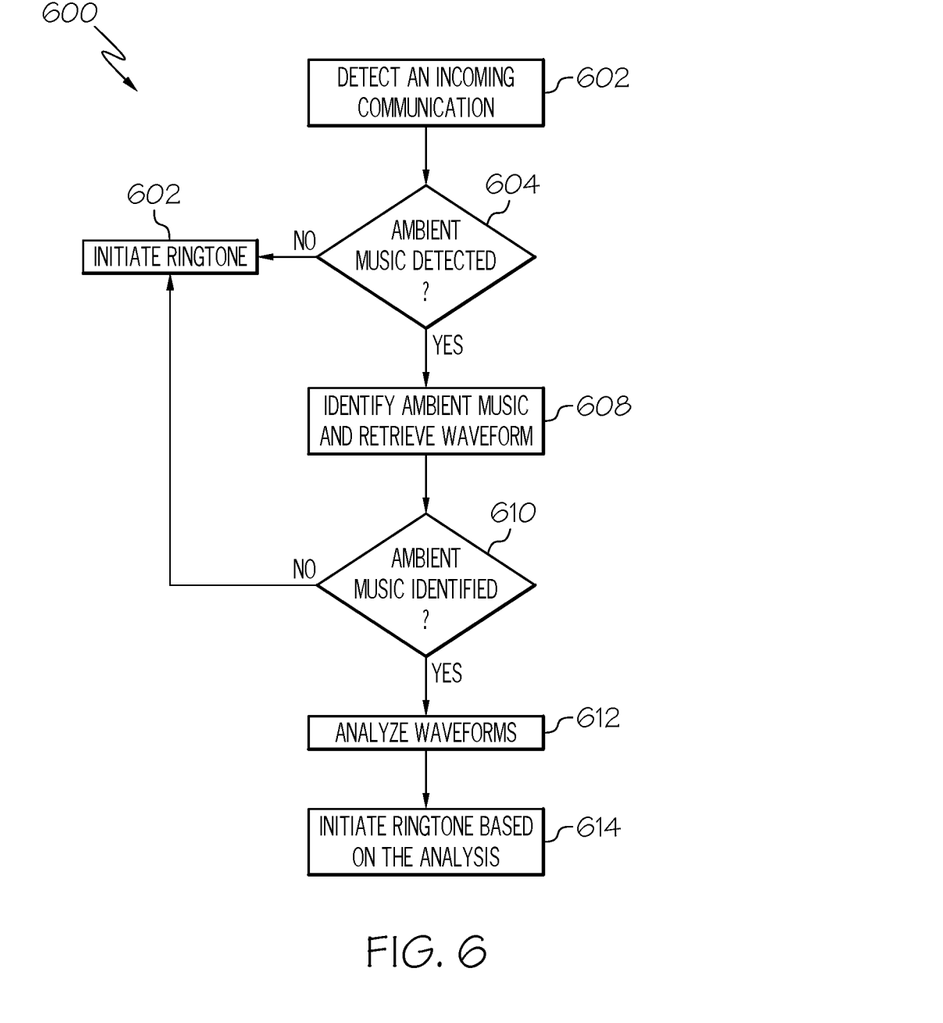
FIG. 6 shows a process flowchart 600 for optimizing a ringtone on a mobile communication device so that it may be audible to a user among ambient music according to illustrative embodiments.

Referring now to FIG. 6, in conjunction with FIG. 3, an implementation of a process flowchart 600 for optimizing a ringtone on a mobile communication device so that it may be audible to a user among ambient music is shown. At step 602, communication detection component 152 detects an incoming communication (e.g., phone call) that is associated with a ringtone on recipient communication device 56. At step 604, ambient music identification component 154 detects whether ambient music is playing within a vicinity of recipient communication device 56. If not, at step 602, the ringtone is initiated. If ambient music is detected, ambient music identification component 154 attempts, at step 608, to identify the ambient music. At step 610, if the ambient music is not identified, the ringtone is initiated. If the ambient music is identified, ambient music identification component 154 retrieves a waveform associated with the ambient music. At step 612, ringtone waveform analysis component 156 analyzes a waveform associated with the ringtone and ambient music waveform analysis component 158 analyzes the retrieved waveform associated with the ambient music. At step 614, the ringtone is initiated based on the analysis. For example, a peak of the ringtone waveform may be aligned with a trough of the ambient music waveform to determine a point to initiate the ringtone among the ambient music.

Process flowchart 600 of FIG. 6 illustrates the architecture, functionality, and operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks might occur out of the order depicted in the Figures. For example, two blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices, or the like. A system or unit may also be implemented in software for execution by various types of processors. A system or unit or component of executable code may, for instance, comprise one or more physical or logical blocks of computer instructions, which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. For instance, program/utility 40 may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Any of the components provided herein can be deployed, managed, serviced, etc., by a service provider that offers to deploy or integrate computing infrastructure with respect to a process for optimizing a ringtone on a mobile communication device so that it may be audible to a user among ambient music. Thus, embodiments herein disclose a process for supporting computer infrastructure, comprising integrating, hosting, maintaining, and deploying computer-readable code into a computing system (e.g., computer system/server 12), wherein the code in combination with the computing system is capable of performing the functions described herein.

In another embodiment, the invention provides a method that performs the process steps of the invention on a subscription, advertising, and/or fee basis. That is, a service provider, such as a Solution Integrator, can offer to create, maintain, support, etc., a process for optimizing a ringtone on a mobile communication device so that it may be audible to a user among ambient music. In this case, the service provider can create, maintain, support, etc., a computer infrastructure that performs the process steps of the invention for one or more consumers. In return, the service provider can receive payment from the consumer(s) under a subscription and/or fee agreement, and/or the service provider can receive payment from the sale of advertising content to one or more third parties.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may also be a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network (for example, the Internet, a local area network, a wide area network and/or a wireless network). The network may comprise copper transmission cables, optical transmission fibers, wireless transmission, routers, firewalls, switches, gateway computers and/or edge servers. A network adapter card or network interface in each computing/processing device receives computer readable program instructions from the network and routes the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises a document of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

It is apparent that there has been provided herein approaches for optimizing a ringtone on a mobile communication device so that it may be audible to a user among ambient music. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A computer-implemented method for optimizing a ringtone, the method comprising:
   detecting, in response to an event to initiate the ringtone on a recipient communication device, an ambient music within a vicinity of the recipient communication device;
   retrieving, based on an identification of the ambient music, a waveform associated with the ambient music;

analyzing a waveform associated with the ringtone and the retrieved waveform associated with the ambient music; and initiating, based on the analysis, the ringtone on the recipient communication device that maximizes an audibility of the ringtone within the vicinity, wherein the event includes an incoming communication that is selected from a group consisting of a voice call, video call, short message service message, multimedia messaging service message, instant message, and push message from a mobile application.

2. The computer-implemented method of claim 1, wherein analyzing a waveform associated with the ringtone includes locating a peak in the waveform.

3. The computer-implemented method of claim 2, wherein analyzing the retrieved waveform associated with the ambient music includes locating a trough in the retrieved waveform.

4. The computer-implemented method of claim 3, wherein the trough is located in a point in the ambient music following a time the incoming communication is detected.

5. The computer-implemented method of claim 4, further comprising initiating the ringtone includes aligning the peak with the trough to determine a point to initiate the ringtone among the ambient music.

6. The computer-implemented method of claim 1, further comprising increasing a volume of the ringtone based on the analysis.

7. A computer program product for optimizing a ringtone, the computer program product comprising a computer readable storage device, and program instructions stored on the computer readable storage device which, when executed by a computer device, cause the computer device to:

detect, in response to an event to initiate the ringtone on a recipient communication device, an ambient music within a vicinity of the recipient communication device;

detect an ambient music within a vicinity of the recipient communication device;

retrieve, based on an identification the ambient music, a waveform associated with the ambient music;

analyze a waveform associated with the ringtone and the retrieved waveform associated with the ambient music; and initiate, based on the analysis, the ringtone on the recipient communication device that maximizes an audibility of the ringtone within the vicinity, wherein the event includes an incoming communication that is selected from a group consisting of a voice call, video call, short message service message, multimedia messaging service message, instant message, and push message from a mobile application.

8. The computer program product of claim 7, further comprising program instructions to analyze a waveform associated with the ringtone includes locating a peak in the waveform.

9. The computer program product of claim 8, further comprising program instructions to analyze the retrieved waveform associated with the ambient music includes locating a trough in the retrieved waveform.

10. The computer program product of claim 9, wherein the trough is located in a point in the ambient music following a time the incoming communication is detected.

11. The computer program product of claim 10, further comprising program instructions to initiate the ringtone includes aligning the peak with the trough to determine a point to initiate the ringtone among the ambient music.

12. The computer program product of claim 7, further comprising program instructions to increase a volume of the ringtone based on the analysis.

13. A computer system for optimizing a ringtone, the computer system comprising:

a memory comprising program instructions;

a bus coupled to the memory medium; and a processor for executing the program instructions, the instructions causing the system to:

detect, in response to an event to initiate the ringtone on a recipient communication device, an ambient music within a vicinity of the recipient communication device;

detect an ambient music within a vicinity of the recipient communication device;

retrieve, based on an identification the ambient music, a waveform associated with the ambient music;

analyze a waveform associated with the ringtone and the retrieved waveform associated with the ambient music; and initiate, based on the analysis, the ringtone on the recipient communication device that maximizes an audibility of the ringtone within the vicinity, wherein the event includes an incoming communication that is selected from a group consisting of a voice call, video call, short message service message, multimedia messaging service message, instant message, and push message from a mobile application.

14. The computer system of claim 13, further comprising program instructions to analyze a waveform associated with the ringtone includes locating a peak in the waveform.

15. The computer system of claim 13, further comprising program instructions to analyze the retrieved waveform associated with the ambient music includes locating a trough in the retrieved waveform, wherein the trough is located in a point in the ambient music following a time the incoming communication is detected.

16. The computer system of claim 15, further comprising program instructions to initiate the ringtone includes aligning the peak with the trough to determine a point to initiate the ringtone among the ambient music.

17. The computer system of claim 13, wherein the event is selected from a group consisting of an incoming communication, incoming notification, and alarm.

* * * * *